United States Patent
Sculley

(10) Patent No.: US 6,535,154 B1
(45) Date of Patent: Mar. 18, 2003

(54) ENHANCED NOISE-SHAPED QUASI-DYNAMIC-ELEMENT-MATCHING TECHNIQUE

(75) Inventor: Terry L. Sculley, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/008,486

(22) Filed: Nov. 5, 2001

(51) Int. Cl.[7] ............................................. H03M 3/02
(52) U.S. Cl. ........................ 341/143; 341/144; 341/118
(58) Field of Search ................................ 341/118, 120, 341/143, 144

(56) References Cited

U.S. PATENT DOCUMENTS

| | | | | |
|---|---|---|---|---|
| 4,593,271 A | * | 6/1986 | Candy ........................ | 341/143 |
| 5,221,926 A | | 6/1993 | Jackson ...................... | 341/118 |
| 5,305,004 A | | 4/1994 | Fattaruso .................... | 341/120 |
| 5,329,282 A | | 7/1994 | Jackson ...................... | 341/143 |
| 5,369,403 A | * | 11/1994 | Temes et al. ............... | 341/143 |
| 5,414,424 A | * | 5/1995 | Cabler ........................ | 341/143 |
| 5,648,779 A | * | 7/1997 | Cabler ........................ | 341/143 |
| 5,684,482 A | | 11/1997 | Galton ........................ | 341/144 |
| 5,724,038 A | * | 3/1998 | Koifman et al. ............ | 341/143 |
| 5,856,799 A | | 1/1999 | Hamasaki et al. .......... | 341/144 |
| 5,949,361 A | * | 9/1999 | Fischer et al. .............. | 341/143 |
| 5,982,317 A | | 11/1999 | Steensgaard-Madsen .... | 341/143 |

OTHER PUBLICATIONS

"Delta–Sigma Data Converters: Theory, Design, and Simulation" by Steven Norsworthy, Richard Schreier and Gabor Temes, IEEE Press, 1997, Ch. 8, pp. 251–264 and pp. 278–281.

"A Third–Order Δ–Σ Modulator Using Second–Order Noise–Shaping Dynamic Element Matching", by Akira Yasuda, Hiroshi Tanimoto and Tetsuya Iida, IEEE Journal of Solid–State Circuits, vol. 33, No. 12, Dec. 1998, pp. 1879–1886.

* cited by examiner

Primary Examiner—Howard L. Williams
(74) Attorney, Agent, or Firm—W. Daniel Swayze, Jr.; W. James Brady; Frederick J. Telecky, Jr.

(57) ABSTRACT

Noise-shaped dynamic element matching in analog-to-digital and digital-to-analog converters is increased in such a way that the number of components increases linearly, rather than exponentially, as the number of bits is increased. A processor generates a plurality of input signals for a plurality of digital delta sigma modulators which, in turn, generate a plurality of control signals for selecting a plurality of weighted converter elements. The processor recursively generates the input signals in such a way that the control signals generated by some of the digital delta sigma modulators include error cancellation components to cancel error components in other control signals.

24 Claims, 6 Drawing Sheets

ENHANCED NOISE-SHAPED QUASI-DYNAMIC-ELEMENT-MATCHING TECHNIQUE

BACKGROUND OF THE INVENTION

1. Field of the Invention

The present invention relates generally to improvements in digital-to-analog converters (DACs) and analog-to-digital converters (ADCs) utilizing oversampled operation internally. More particularly, the present invention relates to significantly simplified circuitry for DACs and ADCs using dynamic element matching techniques without a reduction in signal quality.

2. State of the Art

Modern semiconductor technologies require ever smaller feature sizes and circuits. While digital processing of signals makes the achievement of higher performance and smaller circuits possible, the trend to smaller circuits makes the design of low noise analog systems more difficult. Effective conversion circuitry between analog and digital systems therefore is becoming more important as semiconductor technologies shrink. Digital-to-analog converters ("DAC"s) and analog-to-digital converters ("ADC"s) are widely used in electronic devices to convert signals between analog and digital circuitry.

Mismatches in DAC and ADC elements in audio and other systems can create harmonic distortion (i.e., linearity errors) in the signals carried therein. These errors are reduced or eliminated by employing conventional dynamic element matching (DEM) algorithms which convert linearity errors into a noise signal uncorrelated to the input signal. Noise-shaped DEM techniques are useful in oversampled converters, allowing linearity errors to be translated into noise that is pushed toward out-of-band regions of the frequency spectrum.

The frequency spectrum of a signal is a frequency-domain interpretation of a signal and refers to the frequencies which are detected by or of interest to the person or circuit receiving the signal. This is also called the "signal band." In the case of audio DACs, ultimately the only frequencies of concern are those in the audio signal band which can be heard by people, typically assumed to be about 20 Hz to 20 kHz. However, audio DAC circuitry is capable of running at much higher speeds and has some amount of signal energy from DC to far into the MHZ range. An oversampling audio DAC, which conventionally uses a delta-sigma modulator, makes use of the regions in the frequency spectrum outside of the audio signal band, i.e., below 20 Hz and above 20 kHz, in order to provide a low noise, high quality signal in the audio signal band (20 Hz to 20 kHz). However, delta-sigma modulators may generate additional quantization noise outside the signal band. Dynamic element matching (DEM) techniques also take advantage of this to provide good quality conversion in the signal band region even in the presence of a mismatch, while causing more noise in out-of-band regions.

Existing DEM techniques use multiple unit DAC elements and require an exponential increase in circuit complexity as the number of bits in the DAC increases. This is further explained with reference to FIGS. 1A, 1B and 2. A 4-bit DAC 2 having a prior art decoder/processor block 4 is shown in FIG. 1A. FIG. 1B shows an implementation of DAC 2 of FIG. 1A according to the present invention. The decoder/processor circuitry 4 is used to convert the 4-bit input B0,1,2,3 into the 15 control bits C0,1,2 . . . 14 needed to control the individual DAC unit weighting elements 6. FIG. 2 shows one possible implementation of the prior art digital-to-analog converter of FIG. 1A including a detailed implementation of decoder/processor 4 and a back end analog DAC circuit 18 which can be the same as the circuit 2 shown in FIG. 1B. Note that the analog output 19 in FIG. 2 may be a differential analog output signal, which in the implementation shown in FIG. 1B actually is provided using two conductors 19A, 19B, even though the differential analog output signal is shown in FIG. 2 as only a single line 19.

The 4-bit DAC 2 includes 15 DAC unit weighting elements 6-0,1,2 . . . 14, each receiving a corresponding control bit C0,1,2 . . . 14, respectively, that determines if its (+) output is set positive or negative. The (−) output of each of DAC unit weighting elements 6-0,1,2 . . . 14 is opposite to its (+) output. For the DAC 2 shown in FIG. 1B, the weight of each of the (−) outputs 7-0,1,2 . . . 14 is ½, and the weight of each of the (+) outputs 9-0,1,2 . . . 14 also is ½. If the input control bit C for an individual DAC unit element is equal to a "1", its (+) output signal is equal to ½ and its (−) output signal is equal to −½. If the input control bit C for an individual DAC unit element is equal to a "0", its (+) output signal is equal to −½ and its (−) signal is equal to ½. By summing the (+) outputs together by means of summer 11 and summing the (−outputs together by means of summer 13, the outputs $Out^{31}$ and $Out^+$ are produced on output conductors 19A and 19B, respectively, and each has a value which varies from −7.5 to +7.5. Note that for the DAC to produce a differential output of value zero for a particular code, (i.e., $Out^{31}$ and $Out^+$ are equal), the circuitry will need to be modified, such as by subtracting ½ from $Out^+$ and adding ½ to $Out^-$ at all times. That is, if ½ is subtracted from $Out^+$ and added to $Out^-$ at all times, then a zero level differential output is obtained. Note that the new range of values of $Out^+$ is from −7 to +8. The differential output of the DAC, defined as the difference $Out^+ - Out^-$, now may range from −16 to +14. However, for the purposes of the remaining description herein, this modification to obtain a zero level differential output is not assumed.

Referring to FIG. 2, a digital filter modulator, referred to herein as a "MOD", typically including a digital delta sigma modulator, multiple integrators, summers and gain paths, is used as part of the DEM processing portion of the decoder/processing block 4 in the prior art to generate a multi-bit output. Each digital filter modulator 8 has a "D" input which receives a digital input signal. Each digital filter modulator 8 also has a C input or control input, and produces a sum on an output conductors 17. The MOD blocks are just the front ends of digital delta sigma modulators (DDSMs) with their D inputs being where the digital input signal is applied, and their C inputs being where the fed-back quantized signal is applied. Typically, there are internal integrators, sum/difference circuits, and gain paths.

FIG. 2 illustrates a block diagram of a processing section used in prior art DACs with dynamic element matching. In FIG. 2, each MOD filter block 8-0,1,2 . . . 13,14 is preceded by a corresponding scaling block 10-0,1,2 . . . 13,14, respectively, which scales the corresponding input signal C0,1,2 . . . 14 by a factor α. In the example shown, if the input signal C for a particular digital filter modulator MOD 8 is "0", the value of its output 17 is −8, and if the input signal C is 1, the value of the digital filter modulator output 17 is +7. This scaling is determined by the range of values possible from the B0,1,2,3 inputs. In this case, the B0,1,2,3 inputs are interpreted by the MOD blocks as signed digital numbers with a range from −8 to +7. A sort/decision circuit 12 receives the 4-bit input signal B0,1,2,3 and interprets it differently, by first subtracting the minimum signed digital number this input could represent (which in this case is −8) from the actual signed digital number. This results in a new number which is only non-negative and is referred to as the code X. The sort/decision circuit 12 then sets X of the C input bits equal to "1", and the rest equal to "0" . The sort/decision circuit 12 also sorts the sum inputs 17 from highest value to the lowest value. The sum outputs on conductors 17-0,1 . . . 14 are multi-bit digital values which have not yet been quantized. The sort/decision circuit 12 selects the X sum buses 17 with the largest values, and the bits corresponding to those stages will be set to "1"s. The bits corresponding to the rest of the sum outputs 17 are set to "0"s. The digital output C0,1,2 . . . 14 of the sort/decision circuit 12 on bus 23 is then input to an analog back-end circuit 18, such as the DAC 2 shown in FIGS. 1A and 1B, to generate the analog output signal on conductor(s) 19. The digital output C0,1 . . . 14 also is fed back to provide control signals to the inputs of the MOD blocks 8-0,1 . . . 14 as explained below.

This system implements a method of producing a "4-bit" analog output (with nominally 16 possible analog output levels) using 15 unit weighting elements 8-0,1 . . . 14 each controlled by single-bit control signals C-0,1 . . . 14. In this system, the number of unit weighting elements 0-0,1 . . . 14 that are turned on or off is always determined by the digital input signals B0–3 (possibly with some pipelined clock delay). The analog output level generated will typically have a monotonic mapping to the digital input signal level B0–3. For example, a digital signal level given by B0–3 value of −8 may correspond to an analog output level of −7.5. A B0–3 level of −7 may correspond to an analog output level of −6.5. Continuing similarly, a B0–3 level of +7 may correspond to an analog output level of +7.5. As mentioned earlier, this mapping do not provide a possible analog output level of exactly 0, which may be desired, and so the mapping may be modified to provide this. For this example, the mapping described here is assumed. So if the signal B0–3 indicates that a +½ analog output level on conductor (s) 19 is desired, then 8 of the unit weighting elements 6-0,1 . . . 14 will be turned on and 7 of them will be turned off. Similarly, if the signal B0–3 indicates the +7.5 analog output level is desired, then all 15 of the unit weighting elements 6-0,1 . . . 14 will be turned on.

As is well known, in order to prevent mismatch in the unit weighting elements 6-0,1 . . . 14 from introducing harmonic distortion into the information presented by the input signals B0–3, it can be shown that if the one-bit control signals C0,1 . . . 14 that control each unit element 6-0,1 . . . 14 contain very low or no signal harmonic energy, then even in the presence of mismatches of the unit weighting elements there will be little or no harmonic distortion introduced into the analog output on conductor(s) 19 in FIG. 2.

This property is obtained by using a digital delta sigma modulator (DDSM) to generate each controlled signal C0,1 . . . 14 from the original digital input signal B0–3, assuming that the sampling rate is such that the signal band of interest is sufficiently oversampled. There are two objectives of the DEM technique. The first objective is to ensure that the individual control signals contain little or no signal harmonic content and little or no noise in the signal band. The second objective of the DEM technique is that the proper number of unit weighting elements 6-0,1, . . . 14 are turned on to match the number required by the input signal B0–3 as mentioned above. The first objective is important to achieve, since it helps ensure that a high linearity output is obtained with little or no harmonic distortion. The second objective is not absolutely necessary, but it simplifies the design of the entire oversampling DAC system, since the analog back-end will still provide the same nominal (in the sense that the effects of mismatch make it inexact) analog output as it would have if no DEM technique had been used.

In order to accomplish the need for the proper number of unit weighting elements 6-0,1 . . . 14 to be turned on, and to obtain low or no harmonic distortion in the control signals C0, 1 . . . 14, the structure shown in FIG. 2 is used. That structure includes multiple parallel DDSMs with a merged quantizer block (i.e., sort/decision block 12), and the output of sort/decision block 12 generates the digital outputs C0,1 . . . . 14 on the bus 23 to control the unit weighting elements 6-0,1 . . . 14, and is also fed around the DDSMs to the C inputs of each MOD block in FIG. 2. The digital inputs B0–3 on bus 21 are fed to the D inputs of each of the MOD blocks 8-0,1 . . . 14, each of which is essentially a digital delta sigma modulator as described above, only without the quantizer and feedback path. The sort/decision block 12 then looks at the B0–3 digital input and determine from it exactly how many of the control signals C0,1 . . . 14 can be at a high level and how many must be at a low level. Sort/decision block 12 then looks at the sum outputs of each MOD block 8-0,1 . . . 14 on conductors 17-0,1 . . . 14 and sets those MOD blocks with the highest sum outputs to have their control outputs C0-0, 1 . . . 14 at a high level if possible, and after all high settings have been exhausted, the rest of the parallel paths provide low levels on their corresponding control outputs C0,1 . . . 14. This effectively implements 15 parallel DDSMs with the additional the restriction that the number of control outputs C0, 1 . . . 14 that are at a high level is set by the original digital input signal B0–3, so independent quantizer decisions are not used. Instead, the single merged quantizer block (i.e., sort/decision block 12) is used.

As will be clear to one skilled in the art, an 8-bit DAC using the described prior art approach requires 255 unit weighting elements ($2^N-1$ unit weighting elements for an N-bit DAC) in contrast to the 15 unit weighting elements required for a 4-bit DAC. Implementation of an 8-bit DAC in a way similar to that shown in FIGS. 1A, 1B , and 2, with dynamic element matching, also requires 255 control bits and 255 digital filter modulator circuits. Thus, the complexity of the circuitry for a DAC with dynamic element matching increases exponentially with an increase in resolution or number of bits. It should be noted that there are methods of reducing the complexity of the circuitry somewhat, but ultimately there are still $2^N-1$ modified digital filter modulator circuits required. Even for an 8-bit DAC, this amount of circuitry would require a significant amount of space and power even if the digital filter modulator circuits were reduced to circuitry as simple as a D-flip flop and some combinational logic.

Thus, there is an unmet need for an efficient method of implementing a scheme similar to dynamic element matching for DACs having a large number of possible output levels, without exponentially increasing the amount of circuitry as the number of possible DAC output levels increases exponentially.

SUMMARY OF THE INVENTION

Accordingly, it is an object of the invention to provide a DAC using techniques somewhat similar to dynamic element matching techniques in which circuit complexity increases linearly, rather than exponentially, with an increase in bit capacity.

It is another object of the invention to reduce erroneous signals within the signal band caused by quantization and other processing noise in DAC and ADC circuits.

It is another object of the invention to provide a DEM-like technique that can be used to provide oversampling DAC circuits and ADC circuits that are more stable, more robust, have lower analog circuit noise for a given power dissipation, and have lower noise tones than has been previously achievable.

The present invention provides a method and apparatus for enhancing signal quality in circuits employing noise-shaped dynamic element matching techniques. The present invention accomplishes this in a particularly useful way which enables circuit complexity to increase linearly rather than exponentially. In a particular embodiment of a DAC configured according to the present invention, the DAC includes a plurality of delta-sigma modulators, each receiving an appropriate digital input signal from a processor circuit and generating a control signal for a binary weighted converter element. The sum of the outputs from each of the weighted converter elements is an analog signal representative of the digital input signal. Because the control signals each include erroneous signal components, such as quantization noise, in addition to desired signal components, the output of each of the weighted converter elements is erroneous to some extent. To compensate for the error signals, the control signal of a binary weighted converter element of heavier weight is sampled and a portion of the signal included in the input signal for a modulator feeding a binary weighted converter element of lighter weight. This process is repeated for all but the least significant binary weighted converter element. The result of this process is that when the outputs of the weighted converter elements are summed, the error signals in each of the outputs of the heavier weighted converter elements are cancelled by correction components in each of the lighter weighted converter elements such that only the error resulting through the lightest weighted converter element is included in the analog output.

In an ADC embodiment of the present invention, the DAC circuit described above is included in a feedback circuit of an ADC to reduce quantization noise in the ADC. Additionally, because of the methods and circuits through which this invention is accomplished, rather than requiring an exponential increase in circuit complexity for increased resolution (e.g. 4-bit to 8-bit digital signal), the circuit complexity only increases linearly. This is particularly advantageous for circuits which use dynamic element matching techniques because prior art DEM techniques require substantial additional circuitry and physical die space as the number of DAC output levels is increased, for example, to 128, 256, 512 or above.

DETAILED DESCRIPTION OF THE PREFERRED EMBODIMENTS

Figure 1A:
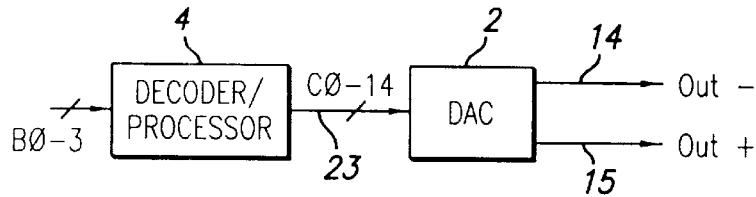
FIGS. 1A and 1B are block diagrams of a prior art digital-to-analog converter emphasizing the DAC unit weighting elements.
Figure 1B:
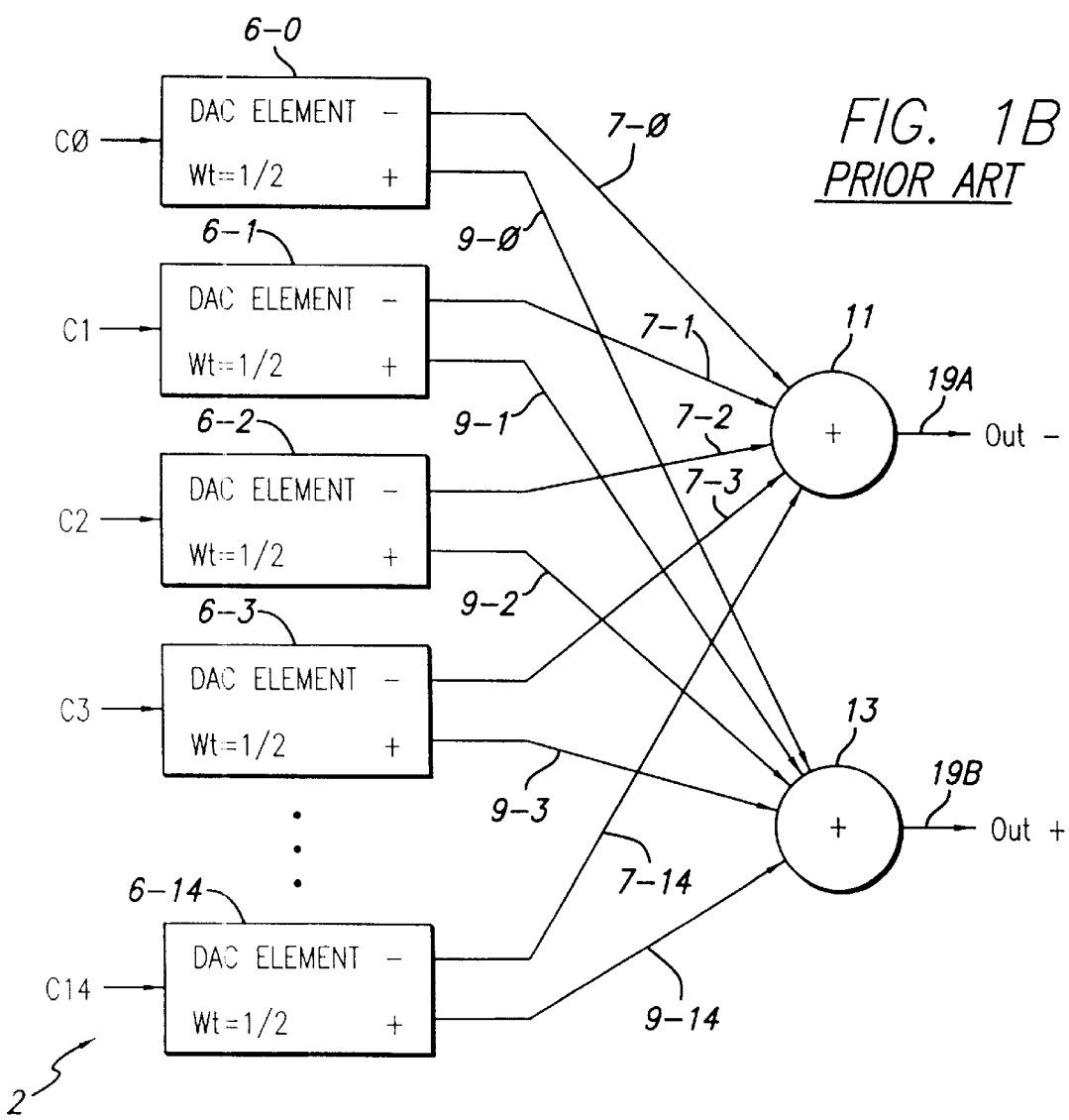
Figure 2:
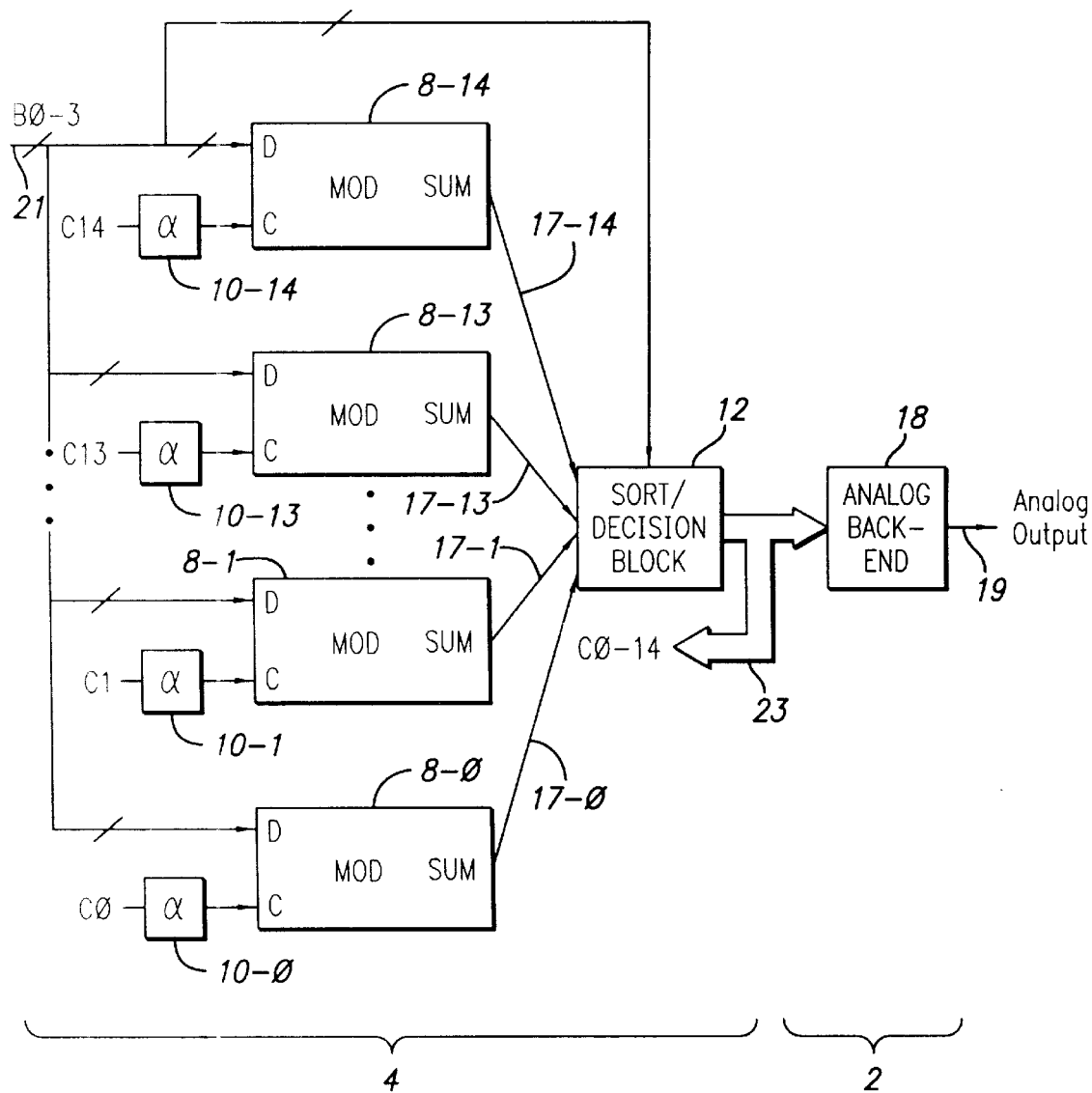
FIG. 2 is a block diagram of a prior art digital-to-analog converter emphasizing the decoding and processing portion of the circuit.
Figure 3:
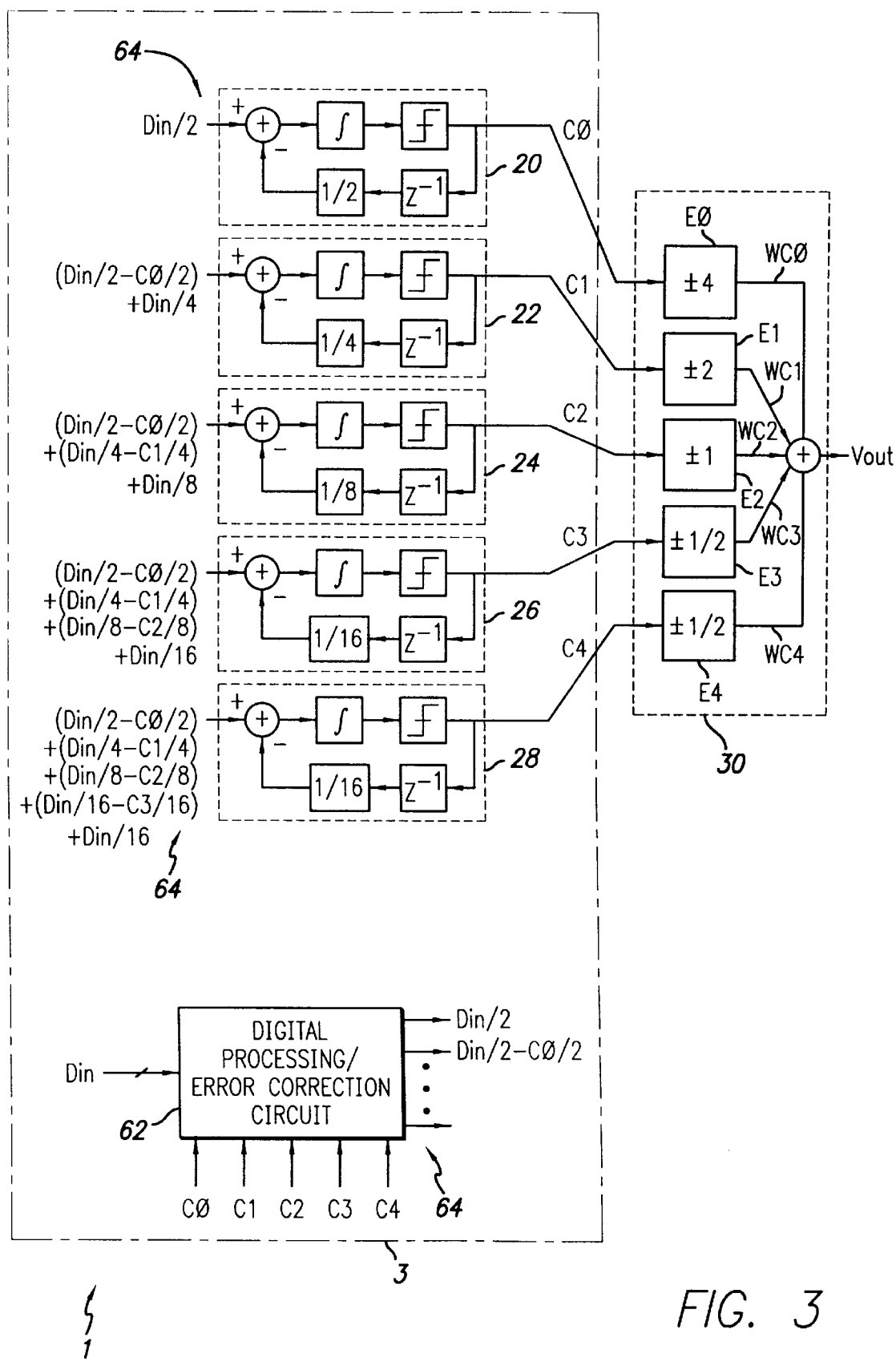
FIG. 3 is a block diagram of a portion of a digital-to-analog converter configured according to an embodiment of the present invention.

FIG. 3 is a diagram of an "approximately 4-bit" DAC 1 which includes a digital processing/error-correction circuit 3 that produces control signals C0–4 which are input to an "analog back-end" circuit 30 according to the present invention. (Actually, DAC 1 can produce 17 possible output levels, which is slightly different than the 16 analog output levels that can be produced by a conventional 4-bit DAC.) Digital processing/error-correction circuit 3 will be described subsequently.

The analog back-end circuit 30 of FIG. 3 includes nominally binary weighted DAC elements E0–4 of weights ±4, ±2, ±1, ±0.5 and ±0.5, respectively. The outputs of the DAC weighting elements E0–4 are the signals WC0–4, respectively. The signals WC0–4 are summed to produce the analog output signal Vout. By using weighting elements with the above weights, the weighting elements may be selected so as to nominally form any of the 17 possible levels from −8 to +8 in steps of 1.0 in response to the appropriate control signals $C_0$, $C_1$, $C_2$, $C_3$ and $C_4$. For purposes of this example, these weighting elements are referred to in descending order by their binary weights as E0 for ±4, E1 for ±2, E2 for ±1, etc.

Ideally, if the 1-bit control signal C0 applied to element E0 is analyzed, its signal band will contain either no significant energy or primarily only signal energy. This also is the case for the 1-bit control signals C1, C2 etc. for each of the other elements E1, E2 etc., respectively. Excessive noise energy in the signal band in the 1-bit control signals C0, C1, C2 etc. may lead to inaccuracies in the analog output Vout of DAC 1.

Before describing digital-processing/error-correction circuit 3 of DAC 1 in detail, it may be helpful to first explain that the core concept behind the use of a noise-shaped DEM algorithm or a noise-shaped quasi-DEM algorithm according to the present invention is to ensure that the signal band of the 1-bit control signals C0, C2 etc. applied to each individual DAC element E0, E1 etc. contain no significant energy other than signal energy, i.e., contains either no significant energy, or only signal energy within the signal band. Note that although the specific examples provided herein are shown in association with "nominally binarily weighted" DAC elements E1, E2 etc., the principles apply equally to DAC elements that are equally weighted. In other words, for any given analog back-end circuit, appropriate control signals such as C0, C1 etc. may be generated following the techniques disclosed herein.

The simplest, but not very useful, way to generate a 1-bit control signal having only signal energy in its signal band is to convert the digital signal Din that would normally be applied to the DAC into a 1-bit signal using a digital delta-sigma modulator, and then apply that same 1-bit signal to all of the DAC weighting elements. This is equivalent to making a 1-bit DAC with a single weighting element of weight ±(4+2+1+0.5+0.5)=±8. However, in the design of oversampled data converters, a single weighting element is not desired, because multibit DACs more effectively reduce the out-of-band noise. Although not described herein, there also are other reasons for the desirability of not using a single weighting element in the design of an oversampled data converter. Therefore, the foregoing simple approach is not recommended.

Generally, the approach of the present invention digitally attenuates the multi-bit digital input Din of the DAC by a factor of 2 and converts it to a 1-bit signal using a conventional delta-sigma modulator 20. This 1-bit signal is used as the control signal C0 and also is used to produce the other control signals C1, C2 etc. for the corresponding analog back-end weighted DAC elements E0, E1, E2 etc. However, since this 1-bit control signal still has some low-level noise or distortion components within the signal band and fairly high level distortion components outside the signal band, the 1-bit control signal may cause an inaccurate analog output. One DDSM is required for each DAC element. However, the number of bits in Din is generally independent from the number of the DDSMs and the number of DAC conversion elements. This is why an ordinary 1-bit DSM DAC can be implemented from any number of Din input bits (8, 12, 16, 20, 24 etc.

The present invention corrects for the noise in the 1-bit control signal generated by the delta-sigma modulator. To accomplish this, the noise is calculated by subtracting the value of the original attenuated multi-bit digital input signal Din from the scaled 1-bit control signal, and the calculated noise value is incorporated into the control bit values for subsequent DAC elements so the other DAC elements E1, E2 etc. can help cancel out these components. This is how the inputs are obtained to be applied to the "later" DDSMs 22, 24, 26 and 28. The expression Din/2–C0/2 is the negated error in the C0 output. The C1 output needs to consist of signal energy (which is why Din/4 is produced) as well as the negated error, so when they are combined in the analog back-end circuit 30, they will all cancel.

Thus, the concept is for the spectra of the 1-bit control signals for the remaining DAC elements to contain not only signal energy, but also "error cancellation energy" designed to help cancel out or correct the unwanted components in the previous 1-bit control signals. Note that in the signal band, the C1 output has (1) signal energy plus (2) other energy derived to cancel the error from the C0 output plus (3) its own error. Then the C2 output will contain essentially signal plus energy to cancel error from the C1 output plus its own error. This process continues recursively. The control signal C1 for the second weighted element E1 will contain some signal energy and some error cancellation energy to cancel out the unwanted components e0 from the control signal C0 for the first element E0, plus it will also contain some unwanted components e1 of its own. The additional unwanted components e1 caused by the second element E1 are then calculated and passed to the circuitry that determines the remaining control signals C2, C3 etc. for cancellation by the remaining DDSM stages.

This approach is shown and described with reference to FIG. 3, in which digital-processing/error-correction circuit 3 includes five first-order digital delta-sigma modulators (DDSMs) 20, 22, 24, 26 and 28 to quantize each of the 1-bit control signal bits C0–4, although more complex (e.g., higher order) digital delta sigma modulators may also be used. The multi-bit DAC digital input is Din. Each of the conventional delta sigma modulators 20, 22, 24, 26, and 28 includes an integrator, the output of which is coupled to the input of a comparator. The output of the comparator is one of the control signals C0, C1, C2, C3, or C4, respectively. The output of each of digital delta signal modulators 20, 22, 24, 26, and 20 is fed back through a delay element $Z^{-1}$ and a scaling circuit to produce a signal which is subtracted from the input of that digital delta sigma modulator to produce an error signal which is input to the integrator. The scaling circuits of delta sigma modulators 20, 22, 24, 26, and 28 perform the scaling by factors of ½, ¼, ⅛, 1/16, and 1/16, respectively. The 1-bit control signal for the first element E0 (the heaviest weighted converter element) is C0, the 1-bit control signal for the second element E1 (the second heaviest weighted converter element) is C1, etc. When each of control signals C0–4 is fed back through the corresponding $Z^{-1}$ circuit and the corresponding gain circuit, the result applied to the (−) input of the summing circuit of each digital delta sigma modulator is +½ or −½, +¼ or −¼, etc.

Digital-processing/error-correction circuit 3 includes a digital processing/error correction circuit 62 that generates the error cancellation inputs generally designated by reference number 64 to each of delta sigma modulators 20, 22, 24, 26 and 28 in response to the multi-bit input signal Din and the control signals C0,1 etc. Digital processing/error correction circuit 62 can be implemented by means of ordinary logic circuitry for performing digital arithmetic, by using separate adders, scalers, and registers for each computation, or by using a centralized processing unit or engine accessing a central memory, etc.

The output of each delta sigma modulator 20, 22, 24, 26 and 28 is equal to its input scaled by the feedback gain, plus an error signal e, with the error signal e being spectrally shaped to be of low magnitude in the signal band, and of higher magnitude in the out-of-band regions. The described example presumes that the value of the multi-bit digital input signal Din ranges from −1 to +1, and that the delta sigma modulator output bits C0, 1 . . . 4 can be either −1 or +1. The outputs of delta sigma modulators 20, 22, 24, 26 and 28 may be represented by the following equations:

$$C_0 = (Din/2)*2 + e0,$$

where e0 is the quantization error introduced by the first DDSM and may consist of both uncorrelated noise as well as correlated noise or harmonics of the DDSM input given by Din/2; mathematically, e0 is simply defined as $e0 = C_0 - (Din/2)*2$, $$C_1 = ((Din/2 - C0/2) + Din/4)*4 + e1,$$

where e1 is the quantization error introduced by the second DDSM and may consist of both uncorrelated noise as well as correlated noise or harmonics of the DDSM input given by Din/2−C0/2+Din/4; mathematically, e1 is simply defined as $e1 = C1 - (Din/2 - C0/2 + Din/4)*4$, $$C_2 = ((Din/2 - C_0/2) + (Din/4 - C_1/4) + Din/8)*8 + e2,$$

where e2 is the quantization error introduced by the third DDSM and may consist of both uncorrelated noise as well as correlated noise or harmonics of the DDSM input given by Din/2−C0/2+Din/4−C¼+Din/8; mathematically, e2 is simply defined as e2=C2−(Din/2−C0/2+Din/4−C¼+Din/8)*8, $$C_3 = ((Din/2 - C_0/2) + (Din/4 - C_1/4) + (Din/8 - C_2/8) + Din/16)*16 + e3,$$

where e3 is the quantization error introduced by the fourth DDSM and may consist of both uncorrelated noise as well as correlated noise or harmonics of the DDSM input given by Din/2−C0/2+Din/4−C¼+Din/8−C2/8+Din/16;

mathematically, e3 is simply defined as e3=C3−(Din/2−C0/2+Din/4−C¼+Din/8−C⅜+Din/16)*16, and $$C_4 = ((Din/2 - C_0/2) + (Din/4 - C_1/4) + (Din/8 - C_2/8) + (Din/16 - C_3/16) + Din/16)*16 + e4,$$

where e4 is the quantization error introduced by the fifth DDSM and may consist of both uncorrelated noise as well as correlated noise or harmonics of the DDSM input given by Din/2−C0/2+Din/4−C¼+Din/8−C⅜+Din/16−C³⁄₁₆+Din/16; mathematically, e4 is simply defined as e4=C4−(Din/2−C0/2+Din/4−C¼+Din/8−C⅜+Din/16−C³⁄₁₆+Din/16)*16.

Analog back-end circuit block 30 receives control signals $C_0$, $C_1$, $C_2$, $C_3$ and $C_4$ and generates an analog output signal Vout by multiplying those control signals by the respective binary scalar gain factors shown for weighting elements E0–4 and summing the results. Thus, the final DAC analog output Vout is:

$$Vout = 4C_0 + 2C_1 + C_2 + C_3/2 + C_4/2,$$

wherein the DAC output range is −8 to +8 in steps of 1.0. Substituting terms and simplifying for each modulator output bit yields:

$$C_0 = Din + e0,$$

$$C_1 = Din - 2*e0 + e1,$$

$$C_2 = Din - 2*e1 + e2,$$

$$C_3 = Din - 2*e2 + e3,$$

$$C_4 = Din - e3 + e4.$$

Substituting terms for the analog output yields:

$$Vout = 8Din + e4/2.$$

In response to Din and control signals C0–C4, digital processing/error correction circuit 62 produces first, second, third, fourth, and fifth attenuated and error-corrected signals to the inputs of digital delta sigma modulator circuits 20, 22, 24, 26, and 28, respectively, according to the expressions $$Din/2,$$

$$Din/2 - C0/2 + Din/4,$$

$$Din/2 - C0/2 + Din/4 - C¼ + Din/8,$$

$$Din/2 - C0/2 + Din/4 - C¼ + Din/8 - C⅜ + Din/16, \text{ and}$$

$$Din/2 - C0/2 + Din/4 - C¼ + Din/8 - C⅜ + Din/16 C³⁄₁₆ + Din/16, \text{ respectively.}$$

From this result, it may be seen that the errors (e) associated with the heavier weighted elements E0, E1, E2 and E3 are removed or canceled, leaving only the error (e4) associated with the last and most lightly weighted element. Because weighting element E4 is so small, its error is highly "attenuated" relative to the error that would typically occur in a 1-bit delta-sigma modulator. Note that this derivation assumes perfect matching in the E0–4 elements, and that the performance is reduced somewhat as the amount of mismatch increases. However, because the initial requirement for the spectra of each control signal to contain little or no signal harmonic energy or noise within the signal band, high linearity performance is still achieved.

Figure 4:
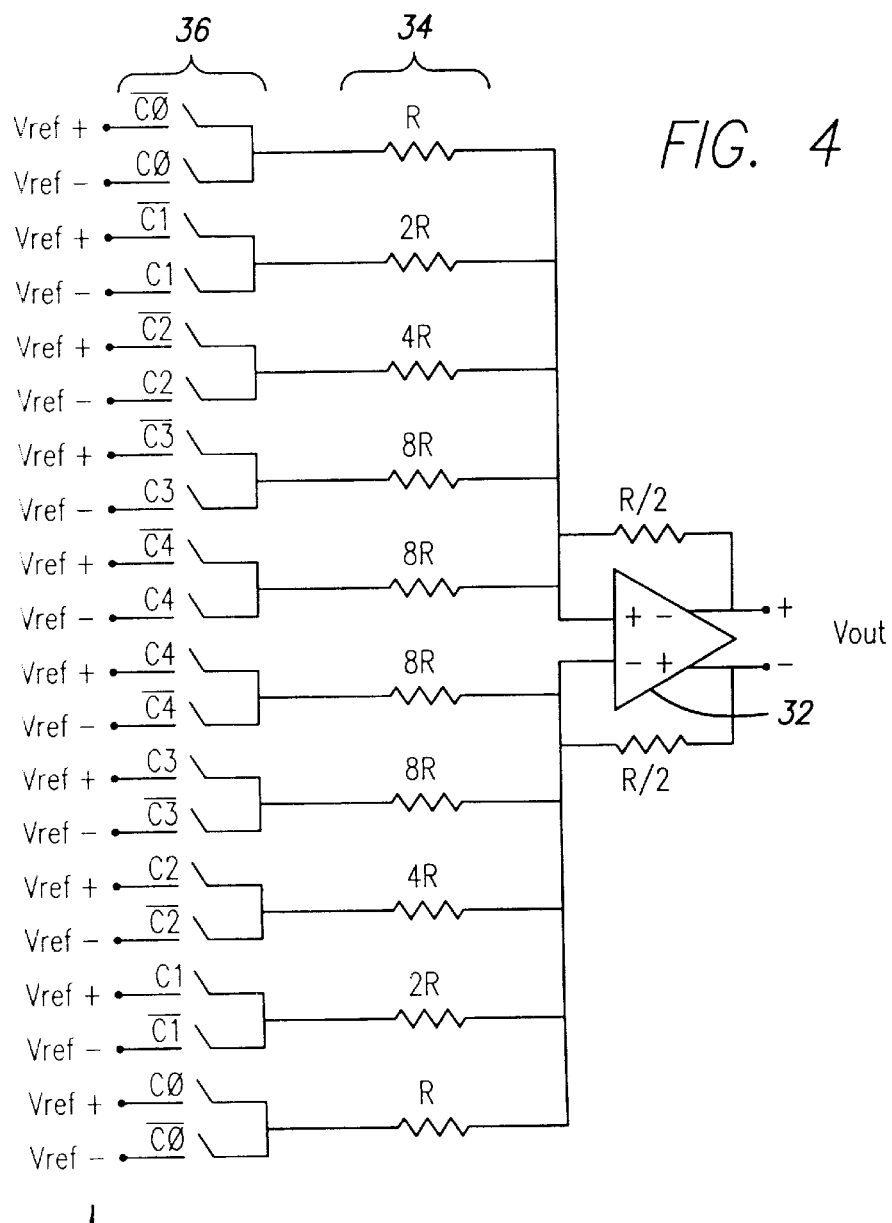
FIG. 4 is a schematic diagram of an analog back-end of a digital-to-analog converter circuit configured according to a particular embodiment of the present invention.

A specific example of one embodiment of analog back-end circuit 30 of FIG. 3 is shown in FIG. 4, using a fully differential operational amplifier 32, resistors 34 and switches 36. However, those skilled in the art will recognize that there are many workable configurations for analog back-end circuit 30.

The foregoing approach may be used to convert any number (N) of digital bits to an analog signal by generating appropriate control signals $C_{N-1}$, which then are multiplied by appropriate scaling factors in the analog back-end circuitry. A significant advantage of this approach over existing prior art approaches is that the hardware complexity scales linearly with the number of DAC bits, rather than exponentially as required by the prior art. For example, for an 8-bit DAC that would have approximately 256 levels, the approach the present invention needs approximately 8 separate digital delta-sigma modulators, which is only a factor of 2 over the number needed by a 4-bit DAC (which would need approximately 4 separate DDSMs).

In contrast, prior art approaches require the complexity of the hardware to scale with or be proportional to the number of analog output levels rather than the number of bits. (For example, a prior art 8-bit DAC would require roughly 16 times the amount of hardware that a prior art 4-bit DAC would require. Because of the linear scaling of hardware complexity, the technique of the present invention is particularly useful for applications wherein the DAC has approximately 4 or more input bits. The advantage is less, however, for DACs having only 2 or 3 input bits.

The technique described herein also is advantageous for higher order noise shaping, wherein the individual delta-sigma modulators are of second order or higher. The advantage of higher order delta-sigma modulators is that the transfer function of the delta-sigma modulator, which affects the control signal bit, has two low-frequency zeros rather than just one. The second low-frequency zero attenuates the noise more at low frequencies than the single zero of a first order modulator. Delta sigma modulators of orders higher than two attenuate noise within the signal band even more, but have disadvantages such as increased hardware complexity and conditionally stable regions. However, the benefits of higher order noise-shaping are significant enough to justify the use of higher order delta-sigma modulators in many applications, depending on the performance level desired. For example, in a simulation using a fourth order analog delta-sigma modulator with an 8-bit quantizer, using only first-order noise-shaping in the DEM, and using a DAC element mismatch of ±1% maximum, a signal to noise ratio (SNR) greater than 145 dB was achieved in the signal band.

Figure 5:
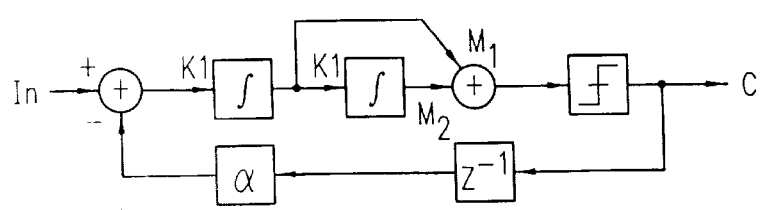
FIG. 5 is a block diagram of a second order modulator circuit configured according to a particular embodiment of the present invention.

Although there are numerous known configurations for a second order delta sigma modulator, one example of a second order delta-sigma modulator which may be substituted for any of the first order modulators 20, 22, 24, 26 and 28 shown in FIG. 3 is illustrated in FIG. 5. The values $K_1$, $K_2$, $M_1$, $M_2$ and a are constant scalar values that can be readily selected by one skilled in the art, depending on the particular application in which the delta sigma modulator will be used. The design of delta-sigma modulators is well known.

It should be noted that there are many known ways to implement the circuitry of the embodiments of this invention, particularly the digital processing portion. One way to implement the invention would be just to design simple digital circuits to perform the functions shown and described herein, such as summing, subtracting, scaling by a constant, integrating, comparing, delaying, etc.

Figure 6:
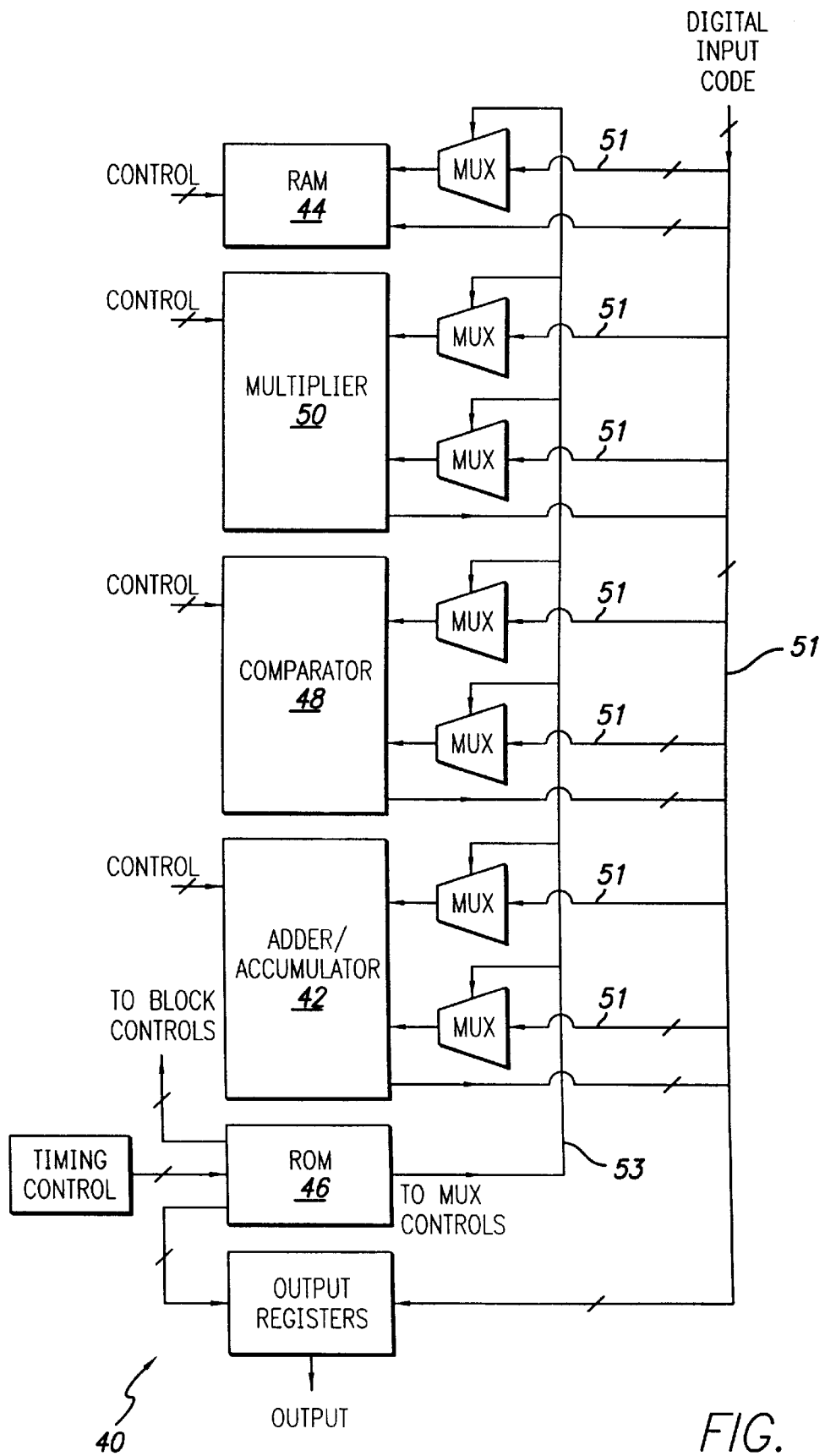
FIG. 6 is a block diagram of a digital-to-analog converter circuit configured as a processing engine according to an embodiment of the present invention.

As shown in FIG. 6, another way to implement the circuitry in block 3 of FIG. 3 would be to use a simple processing engine 40 containing a central adder/accumulator 42, a RAM 44, a ROM 46, a comparator 48 and a multiplier 50. The entire implementation may be programmed into the ROM 46 to drive the processing engine 40. All of the inputs/outputs are coupled to a main data bus 51, with inputs being latched into registers that reside within the processing blocks 42, 44, 48 and 50, and latch signals and other control information Din being provided by ROM 46. The ROM 46 produces multiplexer control signals 53 which are applied to the control inputs of multiplexers as shown. The outputs of the various multiplexers are coupled to the inputs of RAM 44, multiplier circuit 50, comparator circuit 48, and adder/accumulator circuit 42. The conductors of bus 51 are coupled to the inputs of various multiplexers.

One practical implementation of the present invention includes a single multi-bit DAC, wherein an oversampled input is applied to a digital processing block which includes the separate delta-sigma modulators and produces the various 1-bit control lines which are then used to control analog/mixed-signal circuitry, such as the resister/operational- amplifier-based circuit shown in FIG. 4 or a switched-capacitor based circuit using capacitors, operational amplifiers, and switches. For example, a high resolution, low rate digital signal, such as a 24-bit, 48 kHz signal, may be input into a DAC. The input of the DAC may include a digital interpolation filter which increases the sample rate, for example to 128*48 kHz=6.144 MHz. The resolution of this high speed digital signal may be reduced somewhat, or may be maintained at 24-bits, or may even be increased if desired. This digital input would be provided to a conversion block including digital delta-sigma modulators, as shown in FIG. 3, wherein the digital input is Din. The analog output signal then becomes the analog output for the entire oversampled DAC.

Typically, the B0–3 bits are generated as the output of a logic circuit that would, for example, upsample the 24-bit 48 kHz digital input signal to produce a 128*48 kHz signal and then filter the digital signal produced. That result then is input to a digital delta sigma modulator to quantize the oversampled and filtered digital signal down to 4 bits. However, the described invention allows the oversampled and filtered digital signal to instead be quantized down to 8 bits by linearly, rather than exponentially, increasing the number of components and hence the cost. This allows the digital delta sigma modulators to be designed more efficiently, by providing a way to efficiently use a large number of levels in a DAC and still achieve good linearity through the described the DEM-like technique. Better oversampling converters then can be designed which are more stable, more robust, have lower analog circuit noise for a given power dissipation, and have lower noise tone levels therein.

Figure 7:
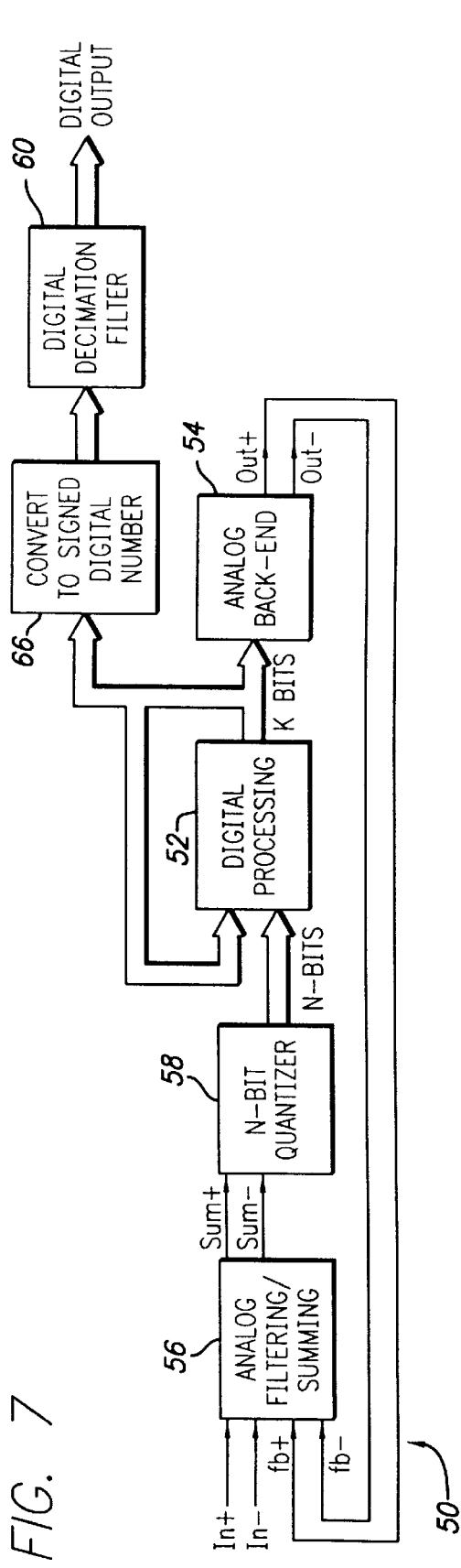
FIG. 7 is a block of an analog-to-digital converter according to an embodiment of the present invention.
Figure 8:
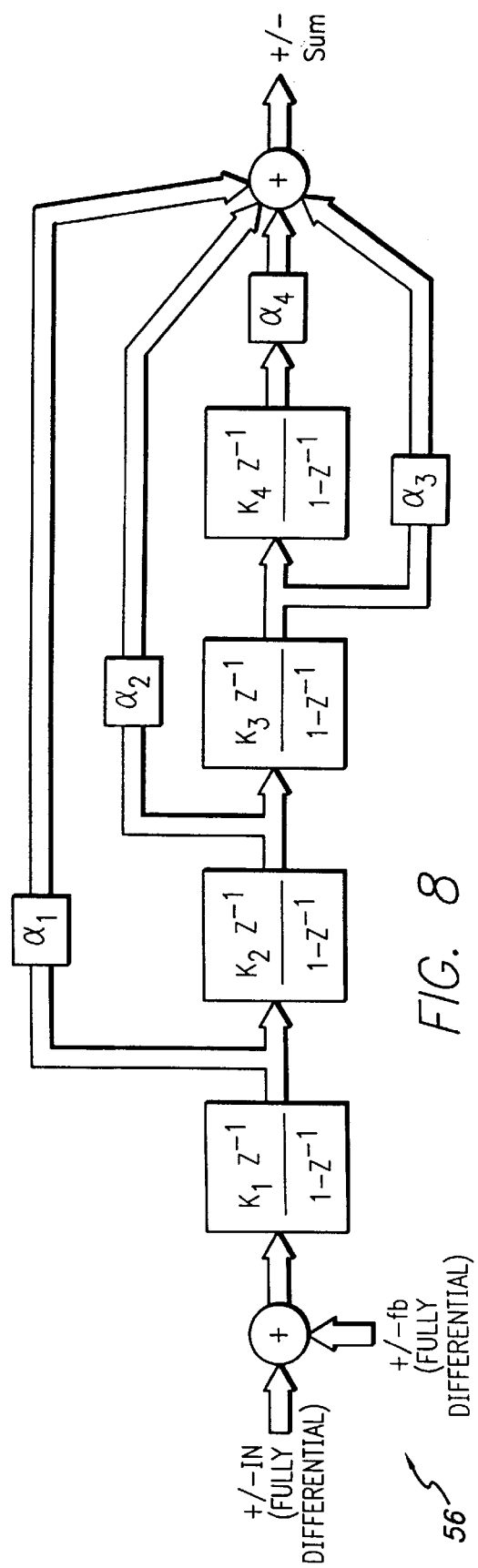
FIG. 8 is a block diagram of an embodiment of the analog filtering/summing circuit block of FIG. 7.

As will be clear to those skilled in the art, the principles described herein which allow the circuit complexity of DACs to be increased linearly rather than exponentially as the number of levels in the analog back-end circuit is increased also are applicable to the design of analog-to-digital converters (ADCs). One example of an ADC block diagram which applies the principles of this invention is shown in FIGS. 7 and 8. FIG. 7 illustrates an ADC 50 which includes an N-bit quantizer 58, a digital processing block 52 and an analog back-end block 54, with the last two blocks 52 and 54 being similar to the blocks 3 and 30, respectively, shown in FIG. 3.

In the ADC 50 of FIG. 7, a fully differential analog signal ±In (i.e., In$^+$–In$^-$) is input to an analog filtering/summing circuit 56, the output of which produces a differential summing signal Sum$^+$–Sum$^-$ that is applied to the input of an N-bit quantizer 58 to convert the analog input signal to an N-bit digital signal. This may be a conventional N-bit flash ADC stage or may use other conventional ADC architectures for converting an analog input signal into an N-bit digital output. This N-bit signal then passes into a digital processing circuit 52 similar to the digital processing/error correction circuit shown in FIG. 3. In this case, the Din signal shown in FIG. 3 corresponds to the N-bit digital output of the N-bit quantizer in FIG. 7. The digital processing circuit 52 generates K one-bit digital signals (similar to the five C0–4 signals generated in FIG. 3) which are used as the control signals going into the binarily weighted analog back end circuit 54, which can be similar to the back-end circuit 30 of FIG. 3, including the E0–4 circuits and a summing circuit. The analog back end circuit 54 can be thought of as having up to $2^K$ possible analog output levels, although it is possible that some levels may be nominally identical. This is similar to the case shown in FIG. 3, where both C3 and C4 contribute a value of ½ to the analog output, so that cases where C3=0, C4=1 and C3=1, C4=0 will give nominally the same analog output, if C0–2 are unchanged.

FIG. 8 shows an example of an analog filtering/summation circuitry block 56. The signal paths of FIGS. 7 and 8 are shown as fully differential. However, a system utilizing a single-ended signal path also could be readily provided. Note that the feedback signal usually would be subtracted from the input signal in a standard delta sigma modulator.

Referring again to FIG. 7, analog back-end circuit 54 typically would be a switched-capacitor circuit rather than a resistor-based circuit. Digital processing circuit 52 could be implemented similarly to circuit 3 of FIG. 3 for the DAC case, with the N-bit quantizer output corresponding to Din in FIG. 3 and the K-bit output corresponding to the C0–4 bits in FIG. 3, using either separate summers/multiplier/registers or a "processing-engine-based" implementation (as shown in FIG. 6). The N-bit digital signal is converted to a signed digital number and then is provided as an input to the conventional digital decimation filter 60 which generates the digital output. The digital decimation filter must first reconstruct the effective signal represented by the K-bit bus into a number. In FIG. 3, this would be comparable to computing Y=4C0+2C1+C2+½C3+½C4 and then feeding Y as a signed digital number into the conventional decimation filter.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims. For example, it should be noted that any number of modulators may be used according to the principles disclosed herein to convert various numbers of digital control bits to analog or analog/digital mixed signals. Furthermore, it is not required that the DAC elements be binary (or mostly-binary) weighted. The DAC elements may alternatively be unit weighted, or some other (even randomized) weighting.

For example, in FIG. 3 as shown the original input signal (Din) is applied in various scaled versions to the inputs of all the modulators, as Din/2, Din/4, Din/8, Din/16, and Din/16, respectively, in addition to how it (Din) appears in the error cancellation components (given by Din/2−C0/2, Din/4−C¼, etc.). Another approach would be to instead apply the original input signal Din only to the first modulator, then do not apply any other scaled versions of this Din to later modulators, other than what is necessary in the calculation of the error cancellation components. Thus, all modulators but the first would have as input only error cancellation components, but no additional original input signal component. This approach would result in somewhat different equations than those set forth above.

What is claimed is:

1. A digital-to-analog converter circuit configured to oversample a multi-bit digital input signal and generate an analog output signal representative of the digital input signal, comprising:
   (a) a plurality of modulator circuits each configured to receive a digital input signal and generate a corresponding one of a plurality of control signals, at least some of the plurality of the control signals each having an error component and an error cancellation component for correcting an error component of another of the control signals;
   (b) a plurality of digital-to-analog converter elements having associated weighting elements, the digital-to-analog converter elements being configured to generate a plurality of weighted signals to be summed to produce the analog output signal in response to the plurality of respective control signals, respectively, the polarity of each weighted signal summed to produce the analog output signal being determined by the control signals, respectively; and
   (c) a processing circuit configured to receive the multi-bit digital input signal and generate the digital input signals received by the plurality of modulator circuits, wherein the digital input signals received by some of the modulator circuits each include an error cancellation component corresponding to an error component in a control signal produced by another of the modulator circuits.

2. The digital-to-analog converter circuit of claim 1 wherein the plurality of modulator circuits includes a plurality of digital delta-sigma modulator circuits.

3. The digital-to-analog converter circuit of claim 1 wherein the digital-to-analog converter circuit is an at least 4-bit digital-to-analog converter circuit including 5 digital-to-analog converter elements.

4. The digital-to-analog converter circuit of claim 1 wherein at least some of the associated weighting elements are binarily weighted.

5. The digital-to-analog converter circuit of claim 1 wherein the plurality of digital-to-analog converter elements includes at least a first converter element having an associated first element weight and a second converter element having an associated second element weight less than the first element weight, and wherein the plurality of modulator circuits includes a first modulator circuit configured to generate a first control signal for the first converter element and a second modulator circuit configured to generate a second control signal for the second converter element, wherein the processing circuit generates a digital signal for the second modulator circuit including a portion of the first control signal such that the second converter element compensates for the error associated with the first control signal.

6. The digital-to-analog converter circuit of claim 5 wherein the first modulator circuit includes a first digital delta sigma modulator and the second modulator circuit includes a second digital delta sigma modulator.

7. The digital-to-analog converter circuit of claim 5 wherein the processing circuit generates additional digital signals received by additional ones of the plurality of modulator circuits to generate additional control signals received by additional ones of the plurality of digital-to-analog converter elements, the additional ones of the plurality of digital-to-analog converter elements generating additional ones of the plurality of weighted signals in response to the additional control signals, respectively, and wherein the processor operates to recursively provide a plurality of attenuated and error-corrected digital signals to the inputs of some of the delta sigma modulators, respectively, to reduce error components in some of the additional control signals.

8. A digital-to-analog converter of claim 1 wherein the modulator circuits and the processing circuit are included in a processing engine including memory circuitry, multiplier circuitry, comparator circuitry, adder/accumulator circuitry, and multiplexing circuitry.

9. An analog-to-digital converter circuit for generating a digital output signal representative of an analog input signal, the analog-to-digital converter circuit including analog filtering circuitry configured to receive the analog input signal and an analog feedback signal, and a quantizing circuit receiving an output of the analog filtering circuitry to generate a digital representation of the analog input signal, the analog-to-digital converter circuit further comprising:
   a digital processing circuit configured to receive an N-bit digital signal from the quantizing circuit and generate a K-bit output signal, the digital processing circuit including a plurality of modulator circuits arranged in a predetermined order and each configured to receive a digital input signal and generate a corresponding one of the bits of the K-bit output signal as a plurality of control signals, respectively, at least some of the plurality of the control signals each having an error component and an error cancellation component for correcting an error component of another of the control signals, the digital processing circuit also including a processing circuit configured to receive the N-bit digital signal and generate a plurality of digital input signals received by the plurality of modulator circuits, respectively, wherein the digital input signals received by some of the modulator circuits each include an error cancellation component corresponding to an error component in a control signal produced by another of the modulator circuits; and
   a plurality of digital-to-analog converter elements each having associated element weights and each generating an analog signal that is summed with the other analog signals to produce the analog feedback signal.

10. The analog-to-digital converter circuit of claim 9 including a conversion circuit having an input coupled to receive the K-bit output signal for converting the K-bit output signal to a signed digital number, and also including a digital decimation filter coupled to receive the signed digital number for producing the digital output signal representative of the analog input signal.

11. The analog-to-digital converter circuit of claim 9, wherein the plurality of modulator circuits are digital delta-sigma modulator circuits.

12. The analog-to-digital converter circuit of claim 9, wherein the associated element weights are binarily weighted.

13. The digital-to-analog converter circuit of claim 9 wherein the plurality of digital-to-analog converter elements includes at least a first converter element having an associated first element weight and a second converter element having an associated second element weight less than the first element weight, and wherein the plurality of modulator circuits includes a first modulator circuit configured to generate a first control signal for the first converter element and a second modulator circuit configured to generate a second control signal for the second converter element, wherein the processing circuit generates a digital signal for the second modulator circuit including a portion of the first control signal such that the second converter element compensates for the error associated with the first control signal.

14. The digital-to-analog converter circuit of claim 13 wherein the first modulator circuit includes a first digital delta sigma modulator and the second modulator circuit includes a second digital delta sigma modulator.

15. The digital-to-analog converter circuit of claim 12 wherein the processing circuit generates additional digital signals received by additional ones of the plurality of modulator circuits to generate additional control signals received by additional ones of the plurality of digital-to-analog converter elements, the additional ones of the plurality of digital-to-analog converter elements generating additional ones of the plurality of weighted signals in response to the additional control signals, respectively, and wherein the processor operates to recursively generate each of a plurality of error-corrected digital signals from a higher-order control signal and apply that error-corrected signal to the input of a next-lower-order delta sigma modulator, respectively, to reduce error components in some of the additional control signals.

16. A digital-to-analog converter of claim 9 wherein the modulator circuits and the processing circuit are included in a processing engine including memory circuitry, multiplier circuitry, comparator circuitry, adder/accumulator circuitry, and multiplexing circuitry.

17. A signal conversion circuit for converting a first digital signal to an analog output signal, comprising:

(a) an analog back end circuit including a plurality of weighted conversion elements, a summing circuit coupled to a first terminal of each of the weighted conversion elements, and a plurality of switching circuits each selectively coupling a second terminal of a corresponding weighted conversion element to either a first reference level or a second reference level in response to a corresponding control signal;

(b) a plurality of digital delta sigma modulator circuits arranged in a predetermined order and each having an input and each also having an output coupled to supply the control signal to a corresponding switching circuit; and (c) a digital processing/error correction circuit coupled to receive the first digital signal and the control signals and operative to recursively generate each of a plurality of error-corrected signals from a higher-order control signal and apply that error-corrected signal to the input of a next-lower-order digital delta sigma modulator, respectively, to reduce noise in a plurality of the control signals.

18. A digital to analog converter for converting a digital input signal to an analog output signal, comprising:

(a) an analog back end circuit including a plurality of weighted conversion elements, a summing circuit coupled to a first terminal of each of the weighted conversion elements, and a plurality of switching circuits each selectively coupling a second terminal of a corresponding weighted conversion element to either a first reference voltage or a second reference voltage in response to a corresponding control signal;

(b) a plurality of digital delta sigma modulator circuits arranged in a predetermined order and each having an input and each also having an output coupled to supply the control signal to a corresponding switching circuit; and (c) a digital processing/error correction circuit coupled to receive the digital input signal and the control signals and operative to recursively generate each of a plurality of attenuated and error-corrected signals from a higher-order control signal and apply that attenuated and error-corrected signal to the input of a next-lower-order digital delta sigma modulator, respectively, to reduce noise in a plurality of the control signals.

19. The digital to analog converter of claim 18 wherein the analog output signal is produced substantially according to the equation $Vout=8Din+e4/2$, wherein $e4=C4-(Din/2-C0/2+Din/4-C\frac{1}{4}+Din/8-C\frac{2}{8}+Din/16-C\frac{3}{16}+Din/16)*16$.

20. The digital to analog converter of claim 19 wherein the digital processing/error correction circuit receives first, second, third, fourth, and fifth control signals from outputs of first, second, third, fourth, and fifth digital delta sigma modulator circuits, respectively, according to the expressions $C_0=Din+e0$, where $e0=C_0-(Din/2)*2$, $C_1=Din-2*e0+e1$, where $e1=C1-(Din/2-C0/2+Din/4)*4$, $C_2=Din-2*e1+e2$, where $e2=C2-(Din/2-C0/2+Din/4-C\frac{1}{4}+Din/8)*8$, $C_3=Din-2*e2+e3$, where $e3=C3-(Din/2-C0/2+Din/4-C\frac{1}{4}+Din/8-C\frac{2}{8}+Din/16)*16$, and $C_4=Din-e3+e4$, where $e4=C4-(Din/2-C0/2+Din/4-C\frac{1}{4}+Din/8-C\frac{2}{8}+Din/16C\frac{3}{16}+Din/16)*16$, respectively.

21. The digital to analog converter of claim 20 wherein the digital processing/error correction circuit produces first, second, third, fourth, and fifth attenuated and error-corrected signals to the inputs of the first, second, third, fourth, and fifth digital delta sigma modulator circuits, respectively, according to the expressions $Din/2$, $Din/2-C0/2+Din/4$, $Din/2-C0/2+Din/4-C\frac{1}{4}+Din/8$, $Din/2-C0/2+Din/4-C\frac{1}{4}+Din/8-C\frac{2}{8}+Din/16$, and $Din/2-C0/2+Din/4-C\frac{1}{4}+Din/8-C\frac{2}{8}+Din/16-C\frac{3}{16}+Din/16$, respectively.

22. A method of compensating for error signals in a digital-to-analog converter or analog-to-digital converter, the method comprising:

(a) processing a digital signal to generate a plurality of digital input signals;

(b) passing the plurality of digital input signals through a plurality of modulator circuits, respectively, to cause each modulator circuit to generate a corresponding control signal, the modulator circuits being arranged in a predetermined order, wherein at least some of the control signals each include an error component and an error cancellation component for correcting an error component of another of the control signals;

(c) selecting a corresponding weighted converter element in response to each of the control signals, respectively, to produce a corresponding analog signal;

(d) summing the analog signals to generate an analog signal representative of the digital signal; and (e) performing steps (a) to (d) so as to recursively generate each of a plurality of error-corrected signals from a higher-order control signal and apply that error-corrected signal to the input of a next-lower-order digital delta sigma modulator, respectively, to reduce error components in a plurality of the control signals.

23. The method of claim 22 wherein step (e) includes:

generating a first digital input signal and passing the first digital input signal through a first modulator circuit to produce a first control signal which includes the first error component; and generating a second digital input signal having an error cancellation component corresponding to the first error component in the first control signal, and passing the second digital input signal through a second modulator circuit to produce a second control signal having a second error component.

24. The method of claim 23 wherein the generating of the second digital input signal includes:

calculating the first error component by scaling the first control signal and subtracting the first digital input signal from the scaled first control signal; and incorporating the first error component into the second digital input signal.

* * * * *